United States Patent
Orshansky et al.

(10) Patent No.: US 7,665,047 B2
(45) Date of Patent: Feb. 16, 2010

(54) METHOD FOR PERFORMING POST-SYNTHESIS CIRCUIT OPTIMIZATION

(76) Inventors: Michael Orshansky, 2107 Wychwood Dr., Austin, TX (US) 78746; Murari Mani, 3607 Greystone Dr., Apt. #727, Austin, TX (US) 78731

( * ) Notice: Subject to any disclaimer, the term of this patent is extended or adjusted under 35 U.S.C. 154(b) by 365 days.

(21) Appl. No.: 11/539,671

(22) Filed: Oct. 9, 2006

(65) Prior Publication Data

US 2007/0083832 A1    Apr. 12, 2007

Related U.S. Application Data

(60) Provisional application No. 60/725,958, filed on Oct. 11, 2005.

(51) Int. Cl.
  *G06F 17/50* (2006.01)
(52) U.S. Cl. .............. 716/2; 716/1; 716/18; 716/19
(58) Field of Classification Search ............. 716/1, 716/2, 18, 19
  See application file for complete search history.

(56) References Cited

U.S. PATENT DOCUMENTS 3,083,562 A  *  4/1963  Weizer ................. 70/271

\* cited by examiner

*Primary Examiner*—Thuan Do
(74) *Attorney, Agent, or Firm*—Schwabe, Williamson & Wyatt, P.C.

(57) ABSTRACT

Two methods for post-synthesis circuit optimization are disclosed. In both methods, the underlying variability in process parameters is captured through a robust linear program. The robust linear program is then reformulated as a second order conic program that possesses special structural properties to allow for a computationally efficient solution by using interior point optimization methods. The first method treats gate delays as uncertain quantities and obtains the optimal sizes for gates in a circuit under a probabilistically specified circuit timing target. The second method optimizes total circuit power by using a combination of dual threshold voltage assignment and gate sizing. Both circuit power and timing are treated probabilistically.

9 Claims, 3 Drawing Sheets

METHOD FOR PERFORMING POST-SYNTHESIS CIRCUIT OPTIMIZATION

RELATED APPLICATION

The present application claims priority under 35 U.S.C. §119(e)(1) to provisional application No. 60/725,958 filed on Oct. 11, 2005, the contents of which are incorporated herein by reference.

BACKGROUND OF THE INVENTION

1. Technical Field

The present invention relates to circuit optimization in general, and in particular to methods for performing post-synthesis circuit optimization on an integrated circuit design.

2. Description of Related Art

Generally speaking, an increase in variability of key process parameters, such as effective channel length ($L_{eff}$) and threshold voltage ($V_{th}$), can significantly impact the design and optimization of integrated circuits in the nanometer regime. The increase in variability can be attributed to many factors, such as manufacturing control problems, emergence of new systematic variation-generating mechanisms, etc. But the most important factor that causes an increase in variability is the increase in fundamental atomic-scale randomness such as variations in the number of dopants in transistor channels.

Low-power devices are vulnerable to process variability because devices with low $V_{th}$ tend to exhibit larger sensitivity to variations. On the other hand, high-power devices are also vulnerable to process variability because they tend to have a very high leakage power, which leads to a larger yield loss in the high-performance bin. In addition, leakage power (or standby power) of a device increases as the geometry of the device decreases.

Because of their effectiveness in leakage power reduction, post-synthesis circuit optimization techniques, such as sizing and dual-$V_{th}$ allocation, have been widely explored in a deterministic setting. While relying on different implementation strategies, all of the prior art post-synthesis circuit optimization techniques essentially trade slacks of non-critical paths for power reduction by either reducing transistor sizes and gate sizes or setting them to a higher $V_{th}$. The present disclosure provides two improved methods for performing post-synthesis circuit optimization on integrated circuit designs.

SUMMARY OF THE INVENTION

In accordance with a preferred embodiment of the present invention, a gate-level description of a circuit to be optimized is initially provided. The gates within the circuit are electrically characterized. In addition, the semiconductor manufacturing process intended to be utilized to manufacture the circuit is also characterized. Statistical gate delay models for performing optimization are generated by utilizing the electrical characterization information from the gate characterization and the process variability data from the semiconductor manufacturing process characterization. A robust linear program for gate sizing is formulated by utilizing the generated statistical gate delay models. The robust linear program is then transformed to a second order conic program. Finally, the second order conic program is solved to yield an optimal gate size for each gate within the circuit.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
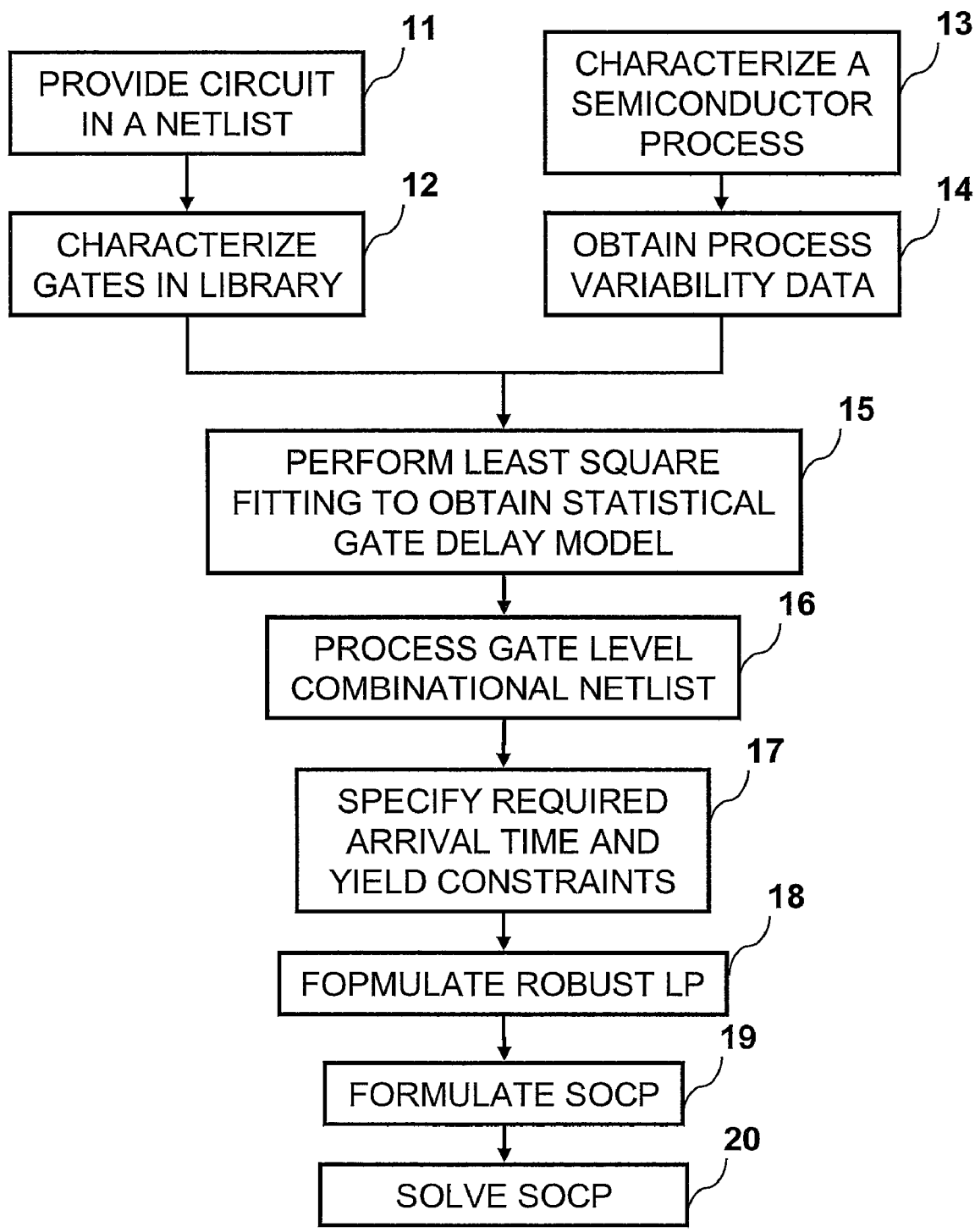
FIG. 1 is a high-level logic flow diagram of a method for performing post-synthesis circuit optimization, in accordance with a preferred embodiment of the present invention.

Referring now to the drawings and in particular to FIG. 1, there is illustrated a high-level logic flow diagram of a method for performing post-synthesis circuit optimization, in accordance with a preferred embodiment of the present invention. Initially, a circuit ready to be optimized is represented in a gate-level description (i.e., a netlist), as shown in block 11. The logic gates within the circuit come from a gate cell library that may include a variety of simple gates, such as NAND2, NAND3, NAND4, NOR2, NOR3, INVERTER, and other complex modules. The size of each gate within the gate cell library determines the speed with which a gate produces a correct output. The gates in the gate 11 cell library are then electrically characterized (or simulated) using a circuit simulator, as depicted in block 12. A circuit simulator, such as HSPICE, can be utilized to characterize the dependence of a gate's delay on the gate's size and the load "seen" by the gate at the gate's output.

In the meantime, a specific semiconductor manufacturing process intended to be utilized to manufacture the circuit from block 11 is empirically characterized, as shown in block 13. Variability data from the semiconductor manufacturing process are analyzed, and any parameters that can most likely affect the performance of the circuit from block 11 are collected, as depicted in block 14. The parameters preferably include effective channel lengths, threshold voltages and gate widths. The results of the characterization from block 13 are then utilized to separate the overall variability of parameters into two scales of variability, namely, within a single chip and between different chips.

Next, the variability data collected in block 14 are used in conjunction with the electrical characterization information from block 12 to generate various statistical gate delay models for performing optimization, as shown in block 15, via the following two steps:

a. express the nominal delay in terms of a set of linear equations that best approximate the delay of a gate in the absence of process variations; and b. model the impact of the variability in the process parameters on gate delay by performing a sensitivity analysis to quantify the effect of each parameter on the delay of a gate.

Steps (a) and (b) together constitute the complete statistical model for gate delay. The emphasis is to model gate delay in a way that permits a user to incorporate the model gate delay into a computationally efficient optimization framework.

The combinational gate level netlist to be sized is subsequently processed, as depicted in block 16. The gates are mapped to the gates in the gate cell library, and the combinational gate level netlist is converted into a format that can be understood by an optimizer.

The required arrival time at the primary outputs of the circuit from block 11 (which are determined from the desired frequency of chip operation) are specified, as shown in block 17. In addition, the desired parametric yield information are supplied to the optimization process.

Using the statistical delay models obtained from block 15, a robust linear program for gate sizing is formulated, as depicted in block 18. The robust linear program involves minimizing the total chip area (as measured by the total of gate sizes) while guaranteeing that the circuit from block 11 meets certain timing constraints specified in block 17. The robust linear program treats the timing constraints probabilistically by using the statistical delay models obtained from block 15. Mathematically, robust optimization seeks to optimize the objective function by ensuring the feasibility of the constraints, under any possible realization of the uncertain conditions of the optimization problem.

In terms of mathematical optimization in block 18, the deterministic sizing problem can be written as:

$$\min \sum_i s_i$$
$$s.t. \; T_{\max} \leq T$$
$$T_{\max} = \max(AT_0) \forall o \in PO$$

where $s_i$ is the size of gate i, T is the specified timing target, $T_{max}$ is the delay of the critical path through the circuit, and $AT_o$ is the required arrival time at primary output o. The robust equivalent of the above-mentioned deterministic problem can be rewritten by making the constraint satisfaction a probability event, which results in the following chance-constrained problem:

$$\min \sum_i s_i$$
$$s.t. P(T_{\max} \leq T) \geq \eta$$
$$T_{\max} = \max(AT_0) \forall o \in PO$$

The robust linear program from block 18 is then reformulated as a second order conic program (SOCP), as shown in block 19. Although SOCPs are non-linear programs, they have a special structure that can be exploited to result in very fast optimizations by using efficient interior point methods. The computational complexity of solving such SOCP is nearly linear, making the overall complexity of the statistical sizing algorithm scale very favorably with the increasing circuit size.

After several transformations under SOCP shown in block 19, a computationally efficient program for sizing can be formulated as:

$$\min \sum_j s_j$$

$$AT_o \leq T, \text{ for } \forall o \in PO$$
$$AT_k \geq AT_j + \bar{d}_j + \phi^{-1}(\alpha)\sigma_{d_j}$$

where $AT_i$ is the arrival time at node i, T is the required arrival time at the primary output. Here, $\bar{d}_j$ and $\sigma_{d_j} = cov(d_j, d_j)^{1/2}$ are the mean and standard deviation of the gate delay.

Finally, the SOCP from block 19 is solved by using an interior point optimization package such as MOSEK™, as depicted in block 20. The output of the optimization method is an assignment of sizes to each gate in the circuit from block 11 such that the specified timing and parametric yield constraints are met.

Figure 2:
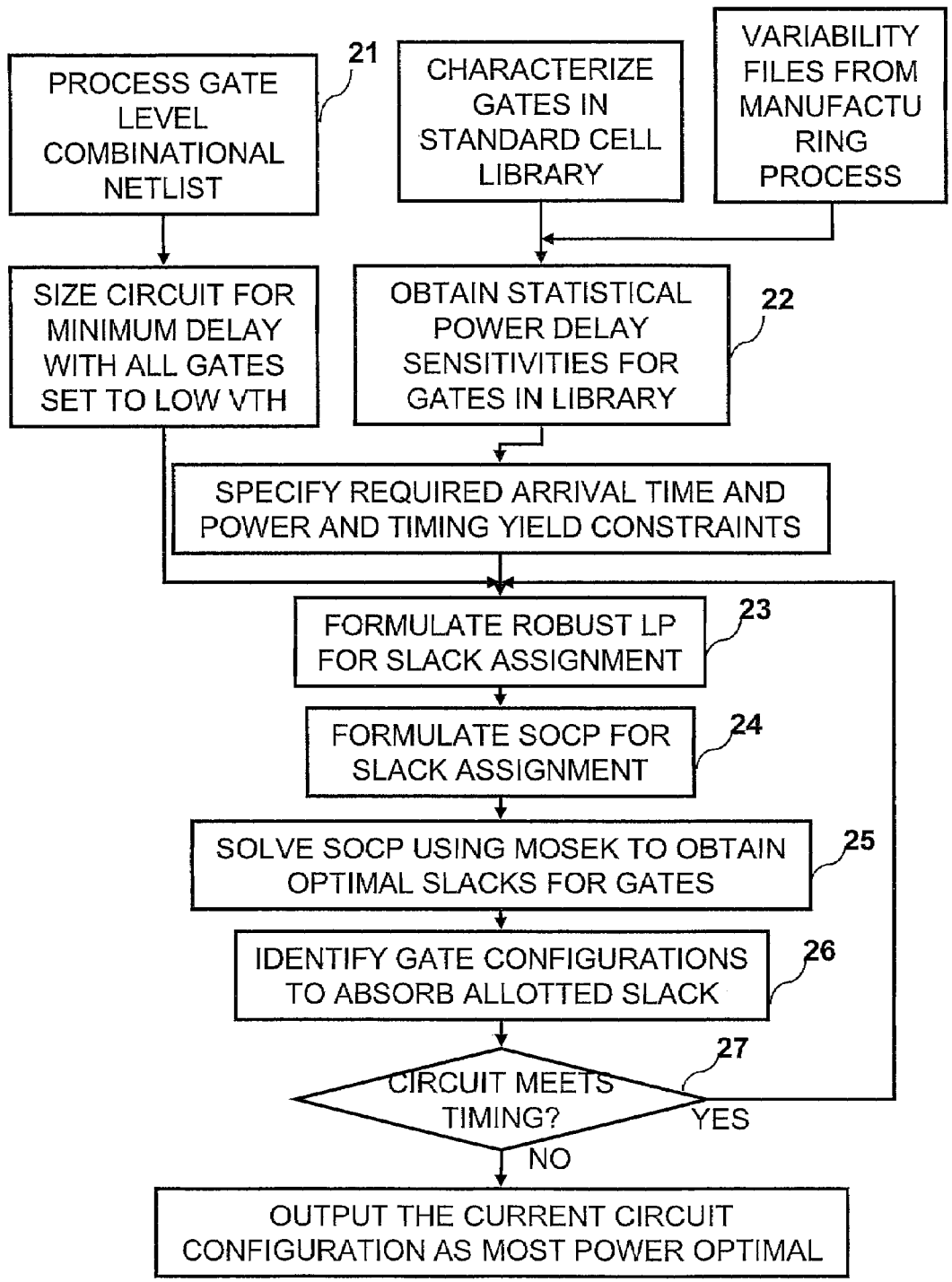
FIG. 2 is a high-level logic flow diagram of a method for performing post-synthesis circuit optimization, in accordance with an alternative embodiment of the present invention.

With reference now to FIG. 2, there is depicted a high-level logic flow diagram of a method for performing post-synthesis circuit optimization, in accordance with an alternative embodiment of the present invention. Initially, a given combinational netlist is mapped to the gates within a standard gate cell library, as shown in block 21. The circuit is then optimized using a well-known method to find gate sizes that maximize slack (or minimize delay) with each of the gates being set to its lowest threshold voltage ($V_{th}$). Because all the gates have the lowest threshold voltage, the resultant circuit has the highest possible power consumption of any circuit, realization.

In the meantime, an optimization is performed using a sensitivity-based algorithm, as depicted in block 22. Power delay sensitivity is defined as the reduction in a gate's power dissipation per unit change in delay. Thus, a higher value of sensitivity implies that the gate is more efficient in converting the additional delay (slack) assigned to the gate into power savings. A power reduction algorithm is then utilized to optimally distribute slack to all the gates within the circuit. In order to enable slack assignment under uncertainty and to model the impact of variability on delay and power, the standard gate cell library is statistically characterized, in which two threshold voltage levels and several discrete gate sizes are assumed to form the cell configuration space. The variance and covariance of the power-delay sensitivity coefficients are characterized using a circuit simulator and any well-known random sampling technique of Monte-Carlo simulation for all the gates within the standard gate cell library.

Next, the variability in the process parameters is captured in terms of a statistical description of the sensitivity vector of the gates in the standard gate cell library, as shown in block 23. The robust linear program for slack assignment is formulated by using those statistical descriptions of the vector of sensitivities. The robust linear program specifies both timing and power constraints in a probabilistic fashion, which requires them to be satisfied only with a certain probability (those correspond to the required parametric yield levels).

In block 23, a linear program can be formulated to distribute slack to gates with the objective of maximizing total power reduction while satisfying the delay constraints on the circuit. This can be expressed as:

maximize $\Sigma s_i d_i$ subject to $t_i \geq t_j + d_i^0 + d_i$, for all j∈fannin(i)

$t_k \leq T_{max}$, for all k∈primary outputs $0 \leq d_i \leq \delta d$ where $t_i$ is the arrival time at node i, $T_{max}$ is the required arrival time at the primary output, $d_i^0$ is the delay of the gate i in the circuit configuration obtained by sizing for maximum slack, $d_i$ is the additional slack assigned, and $\delta d$ is the maximum slack increment.

The robust equivalent of the above linear program is now formulated by probabilistically treating the uncertainty of the sensitivity vector and of timing constraints:

maximize $\Sigma d_i$ subject to $P(\Sigma s_i d_i \geq P_{max} - P) \geq \eta$ $t_i \geq t_j + d_i^0 + d_i$, for all j∈fanin(i)

$P(t_k \leq T_{max}) \geq \zeta$, for all k∈primary outputs $0 \leq d_i \leq \delta d$ Here, the deterministic constraints have been transformed into the probabilistic constraints. These probabilistic constraints set respectively the power-limited parametric yield, $\zeta$, and the timing-limited parametric yield, $\eta$.

The robust linear program formulated in block 23 is then transformed into a SOCP that can be handled by an efficient interior-point method, as depicted in block 24. The transformation requires making both the objective and constraint functions of the optimization problem to contain only linear terms and second order conic terms (which are square roots of quadratic functions) in optimization variables (which are, in the present embodiment, slack allocations).

For block 24, using the mathematical properties of the sensitivity and delay vectors, the robust linear program for slack assignment can be transformed into a SOCP:

maximize $\Sigma d_i$ subject to $\bar{s}^T d + \kappa(\eta)(d^T \Sigma_s d)^{1/2} \leq \ln(\Delta P)/\lambda(\eta)$ $t_i \geq t_j + d_i^0 + d_i$, for all j∈fanin(i)

$t_i \geq t_j + d_i^0 + \phi^{-1}(\zeta)\sigma_{d_i^0} + d_i$, for all j∈fanin(i)

$0 \leq d_i \leq \delta d$ where $\eta$ and $\zeta$ are the power and timing-limited parametric yields; s≈LN $(\bar{s}, \Sigma_s)$ is the log-normal sensitivity vector with mean $\bar{s}$ and covariance matrix $\Sigma_s$; and $\lambda(\eta)$ and $\kappa(\eta)$ are the fitting functions dependent on $\eta$.

The SOCP is then solved using a well-known solver for convex problems and specifically, SOCP problems, that utilizes interior point methods, as depicted in block 25. One example of such a solver is MOSEK™. The result of a single solution is an optimal slack assignment for the gates in the circuit at a given timing specification.

A search is then performed from amongst the gates in the standard gate cell library to identify all the gates that absorb the allotted slack while minimizing power, as depicted in block 26. Those gates are subsequently replaced by a new gate configuration.

The timing of the circuit is checked, as shown in block 27. If the circuit meets timing, the sensitivities and node delays are updated and the process returns to block 23 to reformulate robust linear program using the new sensitivity values. The optimization continues until all the slacks have been exhausted (i.e., the circuit does not meet timing anymore). The circuit configuration at that point should be the most power optimal for the given timing and yield constraints. The output of the optimization method is an assignment of sizes to each gate in the circuit from block 21 with the most optimal power consumption.

As has been described, the present invention provides a method for performing post-synthesis circuit optimization. The method of the present invention finds the optimal logical gate sizes (i.e., geometrical dimensions) as well as the optimal values of gates (transistor) threshold voltages in integrated circuits that minimizes the power of a given circuit under a specific timing (or frequency) specification. The method of the present invention is different from existing post-synthesis optimization methods in that it does so under the conditions of uncertainty about the exact properties of cells due to the variability (or uncertainty) in the semiconductor manufacturing process.

Figure 3:
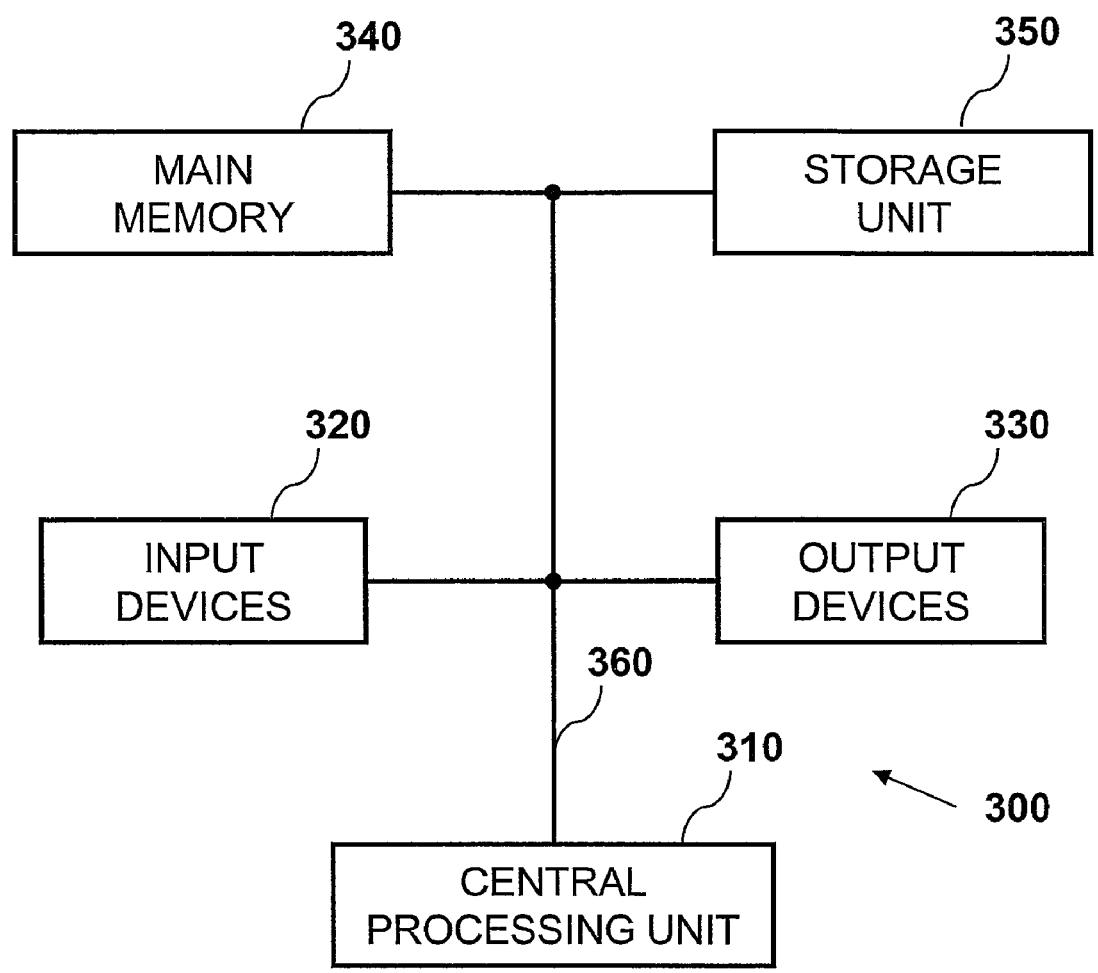
FIG. 3 is a block diagram of a computer system suitable for carrying out various functions of the present invention.

The method of the present invention may be implemented in a computer program product tangibly embodied in a computer-usable medium. With reference now to FIG. 3, there is illustrated a block diagram of a computer system suitable for carrying out various functions of the present invention. As shown, a computer system 300 includes a central processing unit 310, input devices 320, output devices 330, a main memory 340, and a storage unit 350, all connected to a system bus 360. Input devices 320 can be a keyboard and a mouse; and output devices 330 can be a monitor and a printer. Main memory 340 can be a dynamic random access memory; and storage unit 350 can be a hard disk.

Those skilled in the art will appreciate that the mechanisms of the present invention are capable of being distributed as a computer program product in a variety of forms, and that the present invention applies equally regardless of the particular type of signal bearing media utilized to actually carry out the distribution. Examples of signal bearing media include, without limitation, recordable type media such as floppy disks or compact discs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A computer-implemented method for performing post-synthesis circuit optimization, the method comprising:

receiving, by a computing system, a gate-level description of a circuit to be optimized, wherein the gate-level description includes a plurality of gates;

generating, by the computing system, statistical gate delay models using gate characterizations for each of the plurality of gates and process variability data from a semiconductor manufacturing process characterization, the process variability data including one or more process variability parameters;

formulating, by the computing system, a robust linear program using the statistical gate delay models;

transforming, by the computing system, the robust linear program into a second order conic program; and solving, by the computing system, the second order conic program to select a gate size for each of the plurality of gates.

2. The method of claim 1, wherein said generating further comprises:

expressing a nominal delay in terms of a set of linear equations that best approximate a delay of a gate in the absence of process variations; and modeling an impact of the process variations on gate delay by performing a sensitivity analysis to quantify an effect of each of the one or more process parameters on the delay of a gate.

3. The method of claim 1, wherein said formulating further includes expressing a deterministic sizing problem as:

$$\min \sum_i s_i$$
$$s.t.\ T_{\max} \leq T$$
$$T_{\max} = \max(AT_0) \forall o \in PO$$

where $s_i$ is the size of gate i, T is the specified timing target, $T_{max}$ is the delay of the critical path through the circuit, and $AT_o$ is the required arrival time at primary output o.

4. The method of claim 1, wherein said transforming further includes expressing a computationally efficient program for sizing as:

$$\min \sum_j s_j$$
$$AT_o \leq T,\ \text{for } \forall o \in PO$$
$$AT_k \geq AT_j + \bar{d}_j + \phi^{-1}(\alpha)\sigma_{d_j}$$

where $AT_i$ is the arrival time at node i and T is the required arrival time at primary output o.

5. The computer-implemented method of claim 1, wherein the computing system comprises at least one of a central processing unit, a main memory, and a storage unit.

6. An article of manufacture, comprising
a computer-readable storage medium; and
a plurality of programming instructions, stored on the computer-readable storage medium, and executable by a computing device to:
generate statistical gate delay models based at least on electrical characterization information from gate characterizations for each of a plurality of gates from a gate-level description and process variability data from a semiconductor manufacturing process characterization, wherein the process variability data includes one or more process variability parameters;
formulate a robust linear program for gate sizing by using the statistical gate delay models;
transform the robust linear program into a second order conic program; and
solve the second order conic program to select a gate size for each of the plurality of gates.

7. The article of manufacture of claim 6, wherein the plurality of programming instructions are further executable by the computing device to:
express a nominal delay in terms of a set of linear equations that approximate a delay of a gate in the absence of process variations; and
model an impact of the process variations on gate delay by performing a sensitivity analysis to quantify an effect of each of the one or more process parameters on the delay of a gate.

8. The article of manufacture of claim 6, wherein the plurality of programming instructions are further executable by the computing device to express a deterministic sizing problem as:

$$\min \sum_i s_i$$
$$s.t.\ T_{\max} \leq T$$
$$T_{\max} = \max(AT_0) \forall o \in PO$$

where $s_i$ is the size of gate i, T is the specified timing target, $T_{max}$ is the delay of the critical path through the circuit, and $AT_o$ is the required arrival time at primary output o.

9. The article of manufacture of claim 6, wherein the plurality of programming instructions are further executable by the computing device to express a computationally efficient program for sizing as:

$$\min \sum_j s_j$$
$$AT_o \leq T,\ \text{for } \forall o \in PO$$
$$AT_k \geq AT_j + \bar{d}_j + \phi^{-1}(\alpha)\sigma_{d_j}$$

where $AT_i$ is the arrival time at node i and T is the required arrival time at primary output o.

* * * * *

UNITED STATES PATENT AND TRADEMARK OFFICE
CERTIFICATE OF CORRECTION

PATENT NO. : 7,665,047 B2  Page 1 of 1
APPLICATION NO. : 11/539671
DATED : February 16, 2010
INVENTOR(S) : Orshansky et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 495 days.

Signed and Sealed this

Seventh Day of December, 2010

David J. Kappos
*Director of the United States Patent and Trademark Office*